United States Patent
Shirinfar et al.

(10) Patent No.: US 9,721,718 B2
(45) Date of Patent: Aug. 1, 2017

(54) TRANSFORMERS AND METHODS FOR FABRICATING TRANSFORMERS

(71) Applicant: Broadcom Corporation, Irvine, CA (US)

(72) Inventors: Sayedfarid Shirinfar, Granada Hills, CA (US); Ehsan Adabi Firouzjaei, San Jose, CA (US); Tirdad Sowlati, Irvine, CA (US); Ahmadreza Rofougaran, Newport Coast, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 166 days.

(21) Appl. No.: 14/699,944

(22) Filed: Apr. 29, 2015

(65) Prior Publication Data

US 2015/0248964 A1    Sep. 3, 2015

Related U.S. Application Data

(63) Continuation of application No. 13/895,254, filed on May 15, 2013, now Pat. No. 9,048,018.
(Continued)

(51) Int. Cl.
*H03F 3/45*    (2006.01)
*H01F 27/28*    (2006.01)
(Continued)

(52) U.S. Cl.
CPC ......... *H01F 27/2823* (2013.01); *H01F 27/28* (2013.01); *H01F 41/02* (2013.01); *H01F 41/10* (2013.01); *H03F 3/19* (2013.01); *H03F 3/195* (2013.01); *H03F 3/245* (2013.01); *H03F 3/45076* (2013.01); *H03F 3/45179* (2013.01); *H03F 3/68* (2013.01);
(Continued)

(58) Field of Classification Search
USPC .............................. 330/302, 252, 165, 171
IPC .................................................. H03F 3/45,1/00
See application file for complete search history.

(56) References Cited

U.S. PATENT DOCUMENTS 5,274,704 A * 12/1993 Jakab .................. H04M 19/003
                                                    323/356
7,592,866 B2 * 9/2009 Meharry ................. H03F 3/602
                                                    330/165
(Continued)

*Primary Examiner* — Patricia T Nguyen
(74) *Attorney, Agent, or Firm* — McDermott Will & Emery LLP

(57) ABSTRACT

A transformer includes multiple differential ports and first and second transformer windings. The first transformer winding includes a first transformer half-winding coupled to a first differential port of the differential ports. The first transformer winding also includes a second transformer half-winding coupled to a second differential port of the differential ports. An amplifier system that has a transformer is also provided. The amplifier system includes a first and a second stage amplifier. The first stage amplifier includes a first and a second amplifier. The second stage amplifier includes a third and a fourth amplifier. The transformer is coupled between the first stage amplifier and the second stage amplifier, where the transformer has a primary loop and a secondary loop. The primary loop of the transformer may be configured to receive differential signals of the first amplifier. A method for fabricating a transformer is also provided.

20 Claims, 5 Drawing Sheets

Related U.S. Application Data

(60) Provisional application No. 61/811,671, filed on Apr. 12, 2013.

(51) Int. Cl.
*H01F 41/10* (2006.01)
*H03F 3/195* (2006.01)
*H03F 3/24* (2006.01)
*H03F 3/68* (2006.01)
*H01F 41/02* (2006.01)
*H03F 3/19* (2006.01)

(52) U.S. Cl.
CPC .. *H03F 2200/405* (2013.01); *H03F 2200/411* (2013.01); *H03F 2200/451* (2013.01); *H03F 2200/534* (2013.01); *H03F 2200/537* (2013.01); *H03F 2200/541* (2013.01); *H03F 2203/45172* (2013.01); *H03F 2203/45228* (2013.01); *H03F 2203/45394* (2013.01); *Y10T 29/4902* (2015.01)

(56) References Cited

U.S. PATENT DOCUMENTS

| | | | |
|---|---|---|---|
| 7,872,528 B2 | 1/2011 | Bockelman et al. | |
| 8,022,762 B2* | 9/2011 | Kim | H03F 1/3205 330/165 |
| 8,362,835 B2* | 1/2013 | Meharry | H03F 3/602 330/165 |
| 8,674,764 B2* | 3/2014 | Kondo | H03F 1/0277 330/165 |
| 8,729,963 B2* | 5/2014 | Bendixen | H03F 3/195 330/165 |
| 2006/0062378 A1* | 3/2006 | Choksi | H04B 3/03 379/399.01 |
| 2010/0019858 A1* | 1/2010 | McMorrow | H03F 1/56 333/32 |
| 2010/0148869 A1* | 6/2010 | Kawakami | H03F 1/56 330/255 |
| 2011/0221522 A1* | 9/2011 | An | H03F 1/56 330/126 |

* cited by examiner

TRANSFORMERS AND METHODS FOR FABRICATING TRANSFORMERS

CROSS-REFERENCES TO RELATED APPLICATIONS

The present application is a continuation of U.S. patent application Ser. No. 13/895,254, filed on May 15, 2013, titled "LOW INDUCTANCE TRANSFORMER," which in turn claims the benefit of U.S. Provisional Patent Application Ser. No. 61/811,671, titled "LOW INDUCTANCE TRANSFORMER," filed on Apr. 12, 2013, each of which is hereby incorporated by reference in its entirety for all purposes.

BACKGROUND

Wireless transceivers are used in a wide variety of wireless systems. A wireless transceiver (transmitter and receiver) may typically include a wireless receiver for receiving and demodulating signals, and a transmitter for modulating signals for transmission. Wireless systems typically include a multiple-stage power amplifier to amplify and transmit signals. The power amplifier stages may be coupled together via transformers. The transformer may be used for inter-stage matching between the stages of the power amplifier. The inductance of the transformer also may be used to resonate out any capacitance in the power amplifier. The transformer can also perform impedance transformation to provide the power amplifier an optimal load. It can also be used to supply DC power to the amplifier and bias the transistors of the amplifier.

Wireless systems are increasingly designed to target high-speed and high-power transmission applications. To achieve the high-power performance of the wireless transceiver, the power amplifier is designed with large transistors, which in effect produces a large capacitance at the input and output of the power amplifier. As operating frequencies also increase, the capacitance of the power amplifier becomes a dominant factor that determines the resonant inductance. Given that the resonant frequency can be expressed as $f=1/(2\pi\sqrt{LC})$, where C is the capacitance of the power amplifier, and L is the inductance of the transformer, the inductance available to resonate out the power amplifier capacitance decreases. The capacitance of relatively large transistors for high-power applications make the corresponding resonant inductance unfeasible at millimeter-wave frequencies under transformer design approaches. Furthermore, transformer design approaches implemented by full loops suffer from significant routing parasitic inductance which can be comparable to the inductance of the coupled loop.

SUMMARY

A system and/or circuit is provided for a transformer, substantially as illustrated by and/or described in connection with at least one of the figures, as set forth more completely in the claims.

BRIEF DESCRIPTION OF THE DRAWINGS

Certain features of the subject technology are set forth in the appended claims. The accompanying drawings, which are included to provide further understanding, illustrate disclosed aspects and together with the description serve to explain the principles of the disclosed aspects.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of these specific details. In one or more instances, structures and components are shown in block diagram form in order to avoid obscuring the concepts of the subject technology.

In one or more implementations, the subject technology proposes a transformer circuit having low inductance while meeting requirements of high frequency and high-power wireless transceivers. The proposed transformer circuit can be used for inter-stage matching between power amplifiers. As complementary metal-oxide semiconductor (CMOS) technology sizing decreases, high-power high frequency designs are becoming more feasible. As such, the proposed transformer circuit provides half the inductance for respective power amplifiers on a same layout footprint, thus yielding power and area savings.

In some implementations, a transformer has first and second transformer windings including multiple differential ports. Each of the first and second transformer windings include a first transformer half-winding coupled to a first differential port of the differential ports. Each of the first and second transformer windings also include a second transformer half-winding coupled to a second differential port of the differential ports. Each of the first and second transformer windings is divided symmetrically at a common node to form the respective first and second transformer half-windings. The first transformer half-winding is configured to form one half of an inductance in each of the first and second transformer windings. The second transformer half-winding is configured to form another half of the inductance in each of the first and second transformer windings. The common node of the first transformer winding is configured to receive a supply voltage.

Figure 1:
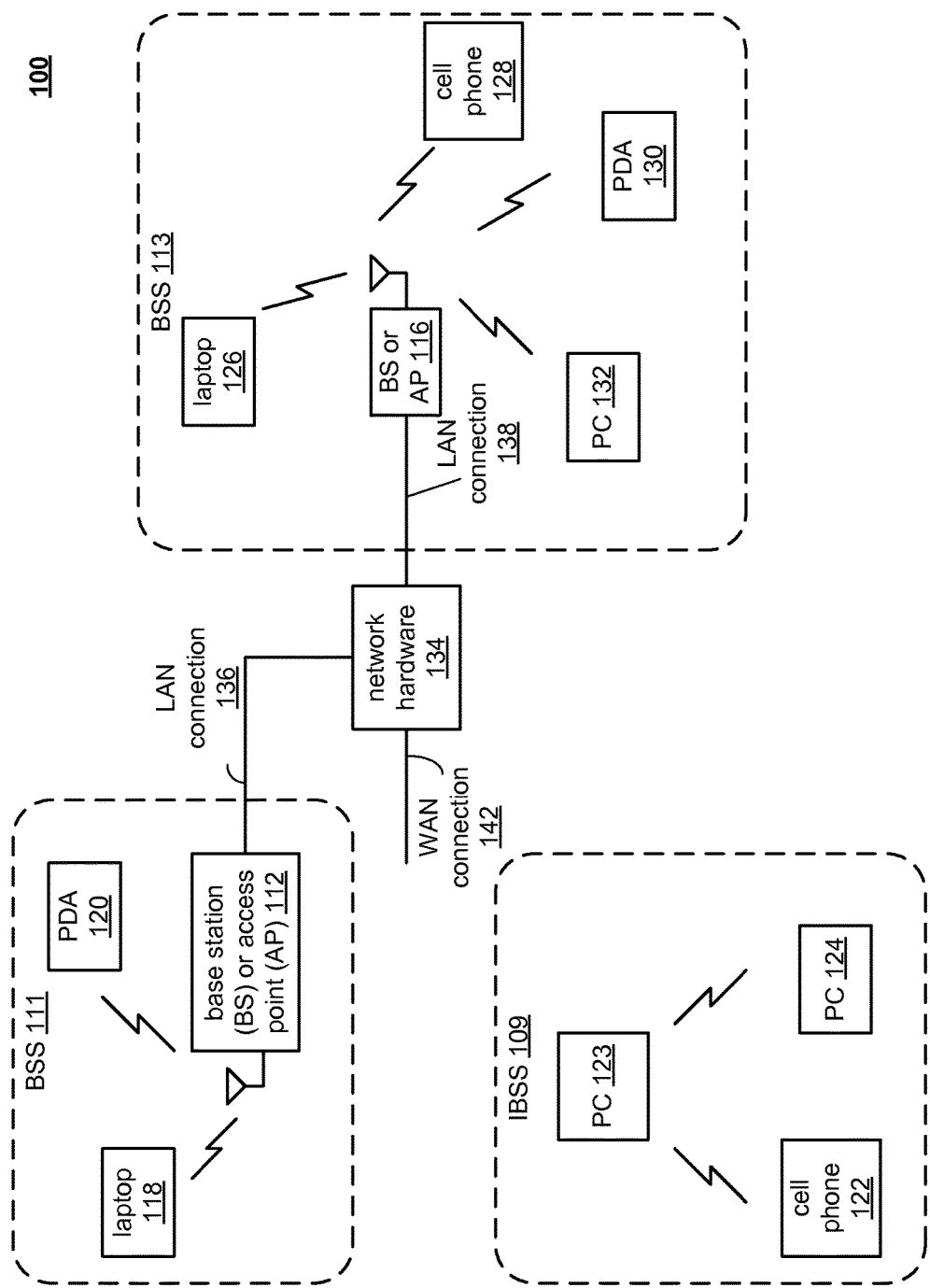
FIG. 1 is a diagram illustrating an example of a wireless communication system in accordance with one or more implementations.

FIG. 1 is a diagram illustrating wireless communication system 100 in accordance with one or more implementations. Wireless communication system 100 includes base stations and/or access points 112, 116, wireless communication devices 118-132 and a network hardware component 134. Note that the network hardware 134, which may be a router, switch, bridge, modem, or system controller, provides a wide area network connection 142 for the wireless communication system 100. Further note that wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within independent basic service set (IBSS) area 109 and communicate directly (e.g., point to point). In this configuration, wireless communication devices 122, 123, and 124 may only communicate with each other. To communicate with other wireless communication devices within the wireless communication system 100 or to communicate outside of the wireless communication system 100, wireless communication devices 122, 123, and/or 124 can affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access points 112, 116 with connectivity to other devices within the wireless communication system 100 and provides connectivity to other networks via the WAN connection 142. To communicate with wireless communication devices 118-132 within BSS 111 and 113, each of the base stations or access points 112, 116 has an associated antenna or antenna array. In one or more implementations, base station or access point 112 wirelessly communicates with wireless communication devices 118 and 120 while base station or access point 116 wirelessly communicates with wireless communication devices 126-132. Wireless communication devices 118-132 can register with a particular base station or access point 112, 116 to receive services from the wireless communication system 100.

According to some implementations, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), enhanced data rates for GSM evolution (EDGE), general packet radio service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
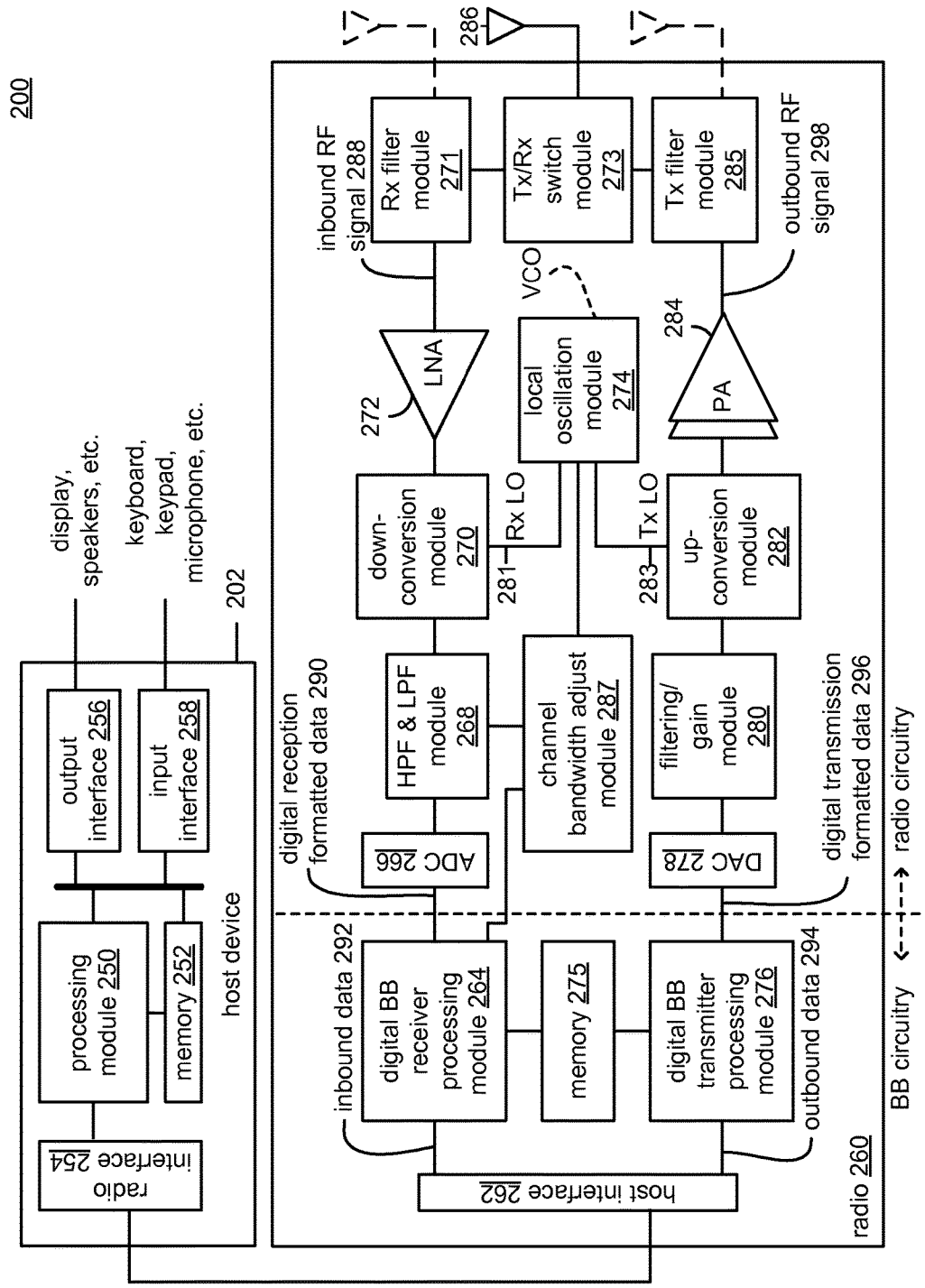
FIG. 2 is a diagram illustrating an example of a wireless communication device that includes a host device and an associated radio in accordance with one or more implementations.

FIG. 2 is a diagram illustrating a wireless communication device 200 that includes a host device 202 (e.g., wireless communication devices 118-132) and associated radio 260. For cellular telephone hosts, radio 260 is a built-in component. For personal digital assistants hosts, laptop hosts, and/or personal computer hosts, the radio 260 may be built-in or an externally coupled component.

As illustrated, host device 202 includes processing module 250, memory 252, radio interface 254, input interface 258, and output interface 256. Processing module 250 is configured to execute corresponding instructions stored in memory 275 that can be performed by host device 202. For example, for a cellular telephone host device, processing module 250 performs the corresponding communication functions in accordance with a particular cellular telephone standard.

Radio interface 254 allows data to be received from and sent to radio 260. For data received from the radio 260 (e.g., inbound data), radio interface 254 provides the data to processing module 250 for further processing and/or routing to output interface 256. Output interface 256 provides connectivity to an output display device such as a display, monitor, or speakers, such that the received data may be presented. Radio interface 254 also provides data from processing module 250 to radio 260. Processing module 250 may receive the outbound data from an input device such as a keyboard, keypad, or microphone via input interface 258 or generate the data itself. For data received via input interface 258, processing module 250 may perform a corresponding host function on the data and/or route it to radio 260 via radio interface 254.

Radio 260 includes host interface 262, digital baseband (BB) receiver processing module 264, analog-to-digital converter 266, high pass and low pass filter module 268, inter-frequency (IF) mixing down conversion stage 270, receiver filter module 271, low noise amplifier 272, transmitter/receiver switch 273, local oscillation module 274 (which may be implemented, at least in part, using a voltage controlled oscillator (VCO)), memory 275, digital BB transmitter processing module 276, digital-to-analog converter 278, filtering/gain module 280, intermediate frequency (IF) mixing up-conversion stage 282, power amplifier 284, transmitter filter module 285, channel bandwidth adjust module 287, and antenna 286. Antenna 286 may be a single antenna that is shared by the transmit and receive paths as regulated by Tx/Rx switch module 273, or may include separate antennas for the transmit path and receive path. The antenna implementation will depend on the particular standard to which the wireless communication device is compliant.

Digital receiver processing module 264 and digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion.

Digital receiver and transmitter processing modules 264 and 276 may be implemented using a shared processing device, individual processing devices, or multiple processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 275 may be a single memory device or multiple memory devices. Such a memory device may be a read-only memory, random access memory, volatile memory, non-volatile memory, static memory, dynamic memory, flash memory, and/or any device that stores digital information. Note that when processing module 264 and/or 276 implements one or more of its functions via a state machine, analog circuitry, digital circuitry, and/or logic circuitry, the memory storing the corresponding operational instructions is embedded with the circuitry including the state machine, analog circuitry, digital circuitry, and/or logic circuitry.

In operation, radio 260 receives outbound data 294 from host device 202 via host interface 262. Host interface 262 routes outbound data 294 to digital transmitter processing module 276, which processes outbound data 294 in accordance with a particular wireless communication standard (e.g., IEEE 802.11, Bluetooth, ZigBee, WiMAX (Worldwide Interoperability for Microwave Access), or any other type of radio frequency based network protocol and/or variations thereof) to produce outbound baseband signals 296. Outbound baseband signals 296 can be digital base-band signals (e.g., have a zero IF) or digital low IF signals, where the low IF can be in the frequency range of one hundred kHz (kilo-Hertz) to a few MHz (Mega-Hertz).

Digital-to-analog converter 278 converts outbound baseband signals 296 from the digital domain to the analog domain. Filtering/gain module 280 filters and/or adjusts the gain of the analog signals prior to providing the signals to IF mixing stage 282. IF mixing stage 282 converts the analog baseband or low IF signals into radio frequency (RF) signals based on transmitter local oscillation 283 provided by local oscillation module 274. Power amplifier 284 amplifies the RF signals to produce outbound RF signals 298, which are filtered by transmitter filter module 285. Antenna 286 transmits outbound RF signals 298 to a targeted device such as a base station, an access point and/or another wireless communication device.

Radio 260 also receives inbound RF signals 288 via antenna 286, which are transmitted by a base station, an access point, or another wireless communication device. Antenna 286 provides inbound RF signals 288 to receiver filter module 271 via Tx/Rx switch 273, where Rx filter 271 bandpass filters inbound RF signals 288. Rx filter 271 provides the filtered RF signals to low noise amplifier 272, which amplifies inbound RF signals 288 to produce amplified inbound RF signals. Low noise amplifier 272 provides the amplified inbound RF signals to IF mixing module 270, which directly converts the amplified inbound RF signals into an inbound low IF signals or baseband signals based on receiver local oscillation 281 provided by local oscillation module 274. Down conversion module 270 provides the inbound low IF signals or baseband signals to filtering/gain module 268. High pass and low pass filter module 268 filters, based on settings provided by channel bandwidth adjust module 287, the inbound low IF signals or the inbound baseband signals to produce filtered inbound signals.

Analog-to-digital converter 266 converts the filtered inbound signals from the analog domain to the digital domain to produce inbound baseband signals 290, where inbound baseband signals 290 will be digital base-band signals or digital low IF signals, where the low IF typically will be in the frequency range of one hundred kHz to a few MHz. Digital receiver processing module 264, based on settings provided by channel bandwidth adjust module 287, decodes, descrambles, demaps, and/or demodulates inbound baseband signals 290 to recapture inbound data 292 in accordance with the particular wireless communication standard being implemented by radio 260. Host interface 262 provides recaptured inbound data 292 to host device 202 via radio interface 254.

Wireless communication device 200 may be implemented using one or more integrated circuits. For example, the host device 202 may be implemented on a first integrated circuit, digital receiver processing module 264, digital transmitter processing module 276 and memory 275 may be implemented on a second integrated circuit, and the remaining components of radio 260, less antenna 286, may be implemented on a third integrated circuit. Alternatively, radio 260 may be implemented on a single integrated circuit. As yet another example, processing module 250 of host device 202 and digital receiver and transmitter processing modules 264 and 276 may be a common processing device implemented on a single integrated circuit. Further, memory 252 and memory 275 may be implemented on a single integrated circuit and/or on the same integrated circuit as the common processing modules of processing module 250 and digital receiver and transmitter processing module 264 and 276.

Any of the various embodiments of the wireless communication device 200 that may be implemented within various communication systems can incorporate functionality to perform communication via more than one standard, protocol, or other predetermined means of communication. For example, the wireless communication device 200 implemented as a single communication device, can include functionality to perform communication in accordance with a first protocol, a second protocol, and/or a third protocol. These various protocols may be WiMAX (Worldwide Interoperability for Microwave Access) protocol, a protocol that complies with a wireless local area network (e.g., WLAN/WiFi) (e.g., one of the IEEE (Institute of Electrical and Electronics Engineer) 802.11 protocols such as 802.11a, 802.11b, 802.11g, 802.11n, or 802.11ac), a Bluetooth protocol, or any other predetermined means by which wireless communication may be effectuated.

Figure 3:
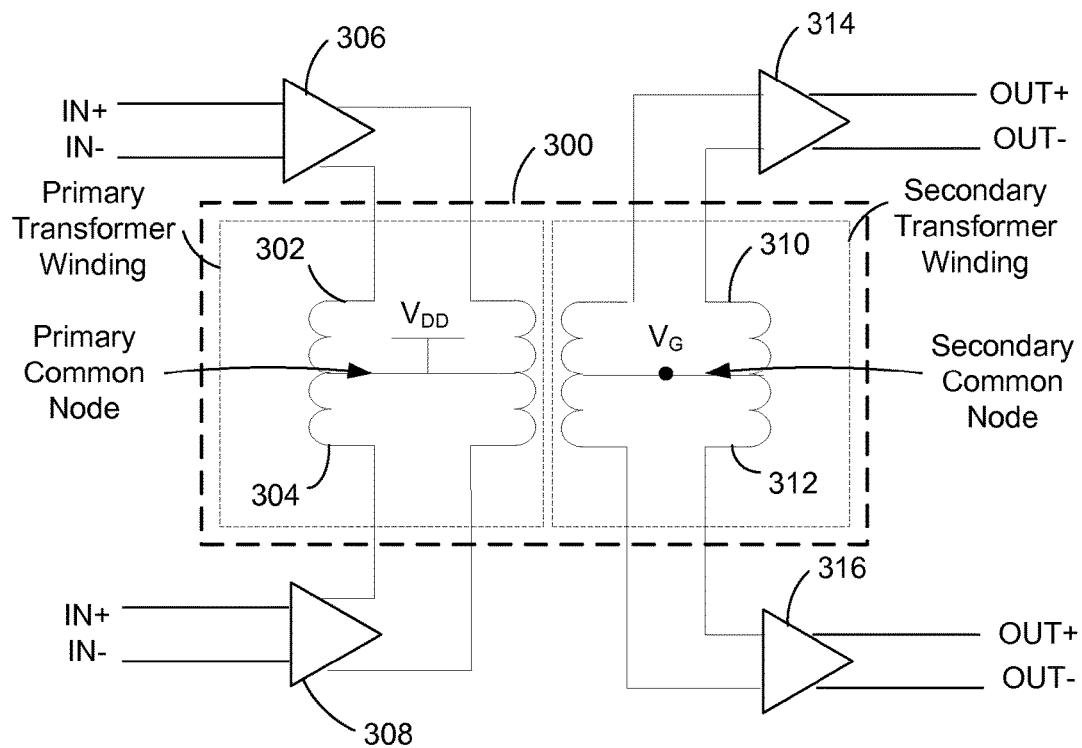
FIG. 3 conceptually illustrates an example of a transformer circuit in accordance with one or more implementations.

FIG. 3 conceptually illustrates transformer circuit 300 in accordance with one or more implementations. Transformer circuit 300 is implemented between multiple stages of power amplifier 284 of FIG. 2. Transformer circuit 300 can be configured for inter-stage matching between power amplifier 284. Transformer circuit 300 also can be configured to resonate out capacitances at the inter-stages of power amplifier 284.

Transformer circuit 300 may be a static electrical device that transfers electrical energy by inductive coupling between primary and secondary winding circuits. A varying current in the primary winding circuit creates a varying magnetic flux in a core of transformer circuit 300 such that the secondary winding circuit experiences a varying magnetic flux. This varying magnetic flux in the secondary winding circuit induces a varying voltage in the secondary winding circuit.

As power requirements increase, transistors of the power amplifier 284 become significantly larger in size. A larger power amplifier transistor has a relatively large capacitance. Because the operating frequency is inversely proportional to resonant inductance (e.g., as frequency increases, the resonant inductance decreases), the amount of inductance needed for high-frequency applications becomes smaller. As such, there is relatively less inductance needed to resonate out the capacitances.

In some aspects, transformer circuit 300 is configured as two full loops that are divided in half thus forming respective half-loops. Given that inductance is defined by the area of the loop, each half-loop realizes half the inductance of the respective loop. Transformer circuit 300 becomes ideal for high-power and high-speed applications without power and area penalties since multiple power amplifiers can share the same loop footprint. The proposed topology of transformer circuit 300 makes the floor planning and layout of transformer circuit 300 more area efficient, which in turn reduces routing parasitics between the transistors' nodes and the transformer ports.

In one or more implementations, transformer circuit 300 includes a primary loop sometimes referred to as a first transformer winding composed of half-loops 302 and 304 and a secondary loop sometimes referred to as a second transformer winding composed of half-loops 310 and 312. The half-loops (sometimes referred to as first and second transformer half-windings) of the primary and secondary loops are associated with respective power amplifiers. In this regard, the primary loop is coupled to an output of a first stage amplifier composed of power amplifiers 306 and 308 and the secondary loop is coupled to an input of a second stage amplifier composed of power amplifiers 314 and 316. The primary loop is configured to resonate out any capacitance observed at the outputs of the first stage amplifier. Similarly, the secondary loop is configured to resonate out any capacitance observed at the inputs of the second stage amplifier. In some aspects, the primary and secondary loops are decreased in size if capacitance at the first and second stage amplifiers is increased.

In some aspects, the primary and secondary loops of transformer circuit 300 are respectively divided into equally-sized loops at a common node (e.g., primary common node, secondary common node) in the loop. Because the power amplifiers (e.g., power amplifiers 306, 308, 314, 316) are each configured to receive and output differential signals, the division of the loop is made at a location that is symmetrical between the differential ports of the respective power amplifier to ensure differential behavior in each of the half-loops. As such, the symmetrical location in the loop represents the common node that does not realize any voltage swing. This division can be made by making a physical connection across the loop, which in turn is coupled to a supply voltage (e.g., $V_{DD}$). In this regard, only the primary loop is configured to receive the supply voltage. It should be appreciated that energy can be transferred to and from between the primary loop and the secondary loop, and therefore between a load and power supply.

In addition, the secondary loop can receive a similar division such that the common node in the secondary loop is configured to receive a bias voltage (e.g., $V_G$) to bias the second stage amplifier. For example, the bias voltage controls the DC current and the RF gain of the second stage amplifier. In some aspects, the same bias voltage can be applied to power amplifiers 314 and 316 of the second stage amplifier. In some aspects, the bias voltage applied to power amplifiers 314 and 316 is different.

In some aspects, a method of fabricating a low inductance transformer is provided. The steps of the method do not need to be performed in the order shown below. The method may include determining a size of a primary loop and a second loop based on multiple design parameters. The design parameters can include, but not limited to, operating frequency, power requirements, line capacitance, load capacitance. In one or more implementations, in determining the size of the primary and secondary loops, the inductance of each loop can be determined based on the given design parameters, such as the frequency and capacitance since $f=1/(2\pi\sqrt{LC})$. As such, the inductance can be expressed as: $L=1/((2\pi f)^2 C)$.

The method also may include providing a respective common node in the primary loop and the secondary loop to form symmetrical half loops in the primary and secondary loops. The symmetrical half loops of the primary loop are each configured to form a respective portion of an inductance in the primary loop. Also, the symmetrical half loops of the secondary loop are each configured to form a respective portion of an inductance in the secondary loop. The method also may include coupling the primary loop to first and second terminals of a first differential port at a location of the primary loop that is symmetrical between the first and second terminals to ensure differential behavior of the primary loop. Similarly, the method also may include coupling the secondary loop to third and fourth terminals of a second differential port at a location of the secondary loop that is symmetrical between the third and fourth terminals to ensure differential behavior of the secondary loop. The method also may include configuring the common node of the primary loop to receive a supply voltage.

The method also may include configuring the common node of the secondary loop to receive a bias voltage to bias the second differential port. In determining the size of the primary loop, the method also may include decreasing the size of the symmetrical half loops of the primary loop if capacitance at the first differential port increases. Similarly, the size of the symmetrical half loops of the secondary loop may be decreased if capacitance at the second differential port increases when determining the size of the second loop.

In some aspects, the winding ratio of the primary loop to the secondary loop may be equivalent to one (e.g., 1:1). In some aspects, the winding ratio of the primary loop to the secondary loop may be less than one (e.g., 1:2). In some aspects, the winding ratio of the primary loop to the secondary loop may be greater than one (e.g., 2:1). In one or more implementations, outputs of power amplifiers 314 and 316 can be combined (not shown) to form a combined power signal based on an inductance of half loops 310 and 312 of the secondary loop.

Figure 4:
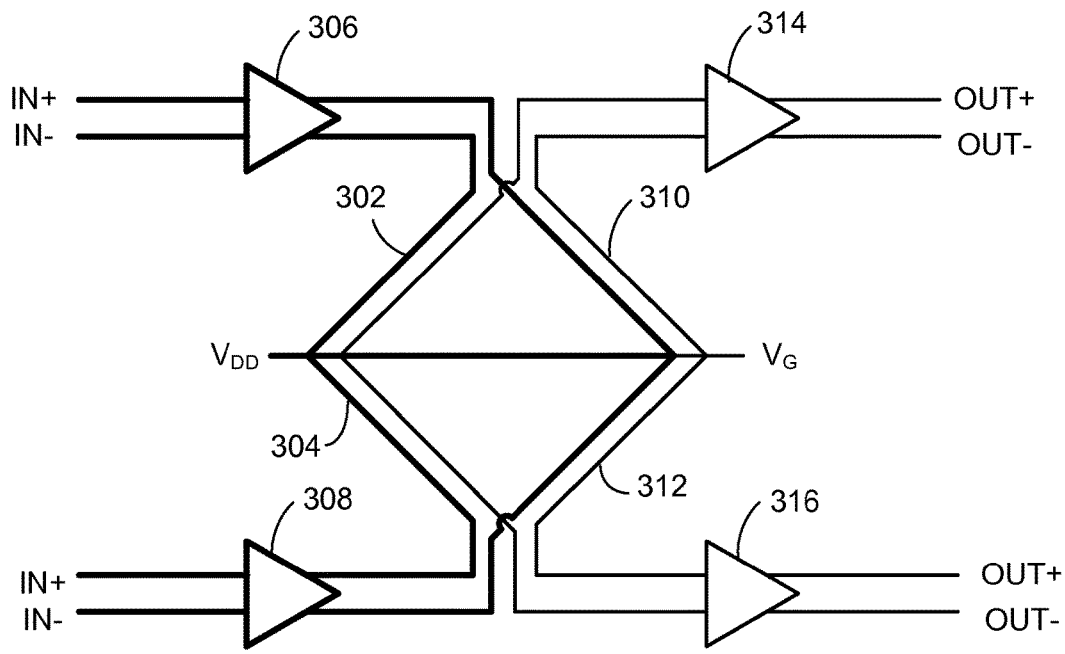
FIG. 4 conceptually illustrates an example of a transformer circuit with a defined geometric shape in accordance with one or more implementations.

FIG. 4 conceptually illustrates transformer circuit 400 with a defined geometric shape in accordance with one or more implementations. In some aspects, transformer circuit 400 can have a specific layout footprint that provides area and power benefits over other layout approaches. Here, transformer circuit 400 can be the same circuit as discussed in FIG. 3, where the primary and secondary loops have a common geometric shape. As such, half-loops 302 and 304 have a common geometric shape. Similarly, half-loops 310 and 312 have a common geometric shape. The geometric shapes available to implement transformer circuit 400 can include, but not limited to, a round layout (or circle-shaped), a triangle layout, a hexagon layout, and a right-angled layout (or square-shaped).

It may be desirable to maintain the differential inputs and outputs of the respective loops as close as possible to minimize area penalties. As such, the half-loops of the primary and secondary loops may have a common layout footprint. In some aspects, the primary and secondary loops may have a separate layout footprint but the half-loops share the same whole loop footprint. In addition, the half-loops of the primary and secondary loops may have a common loop size since the half-loops are symmetrical of one another.

Figure 5:
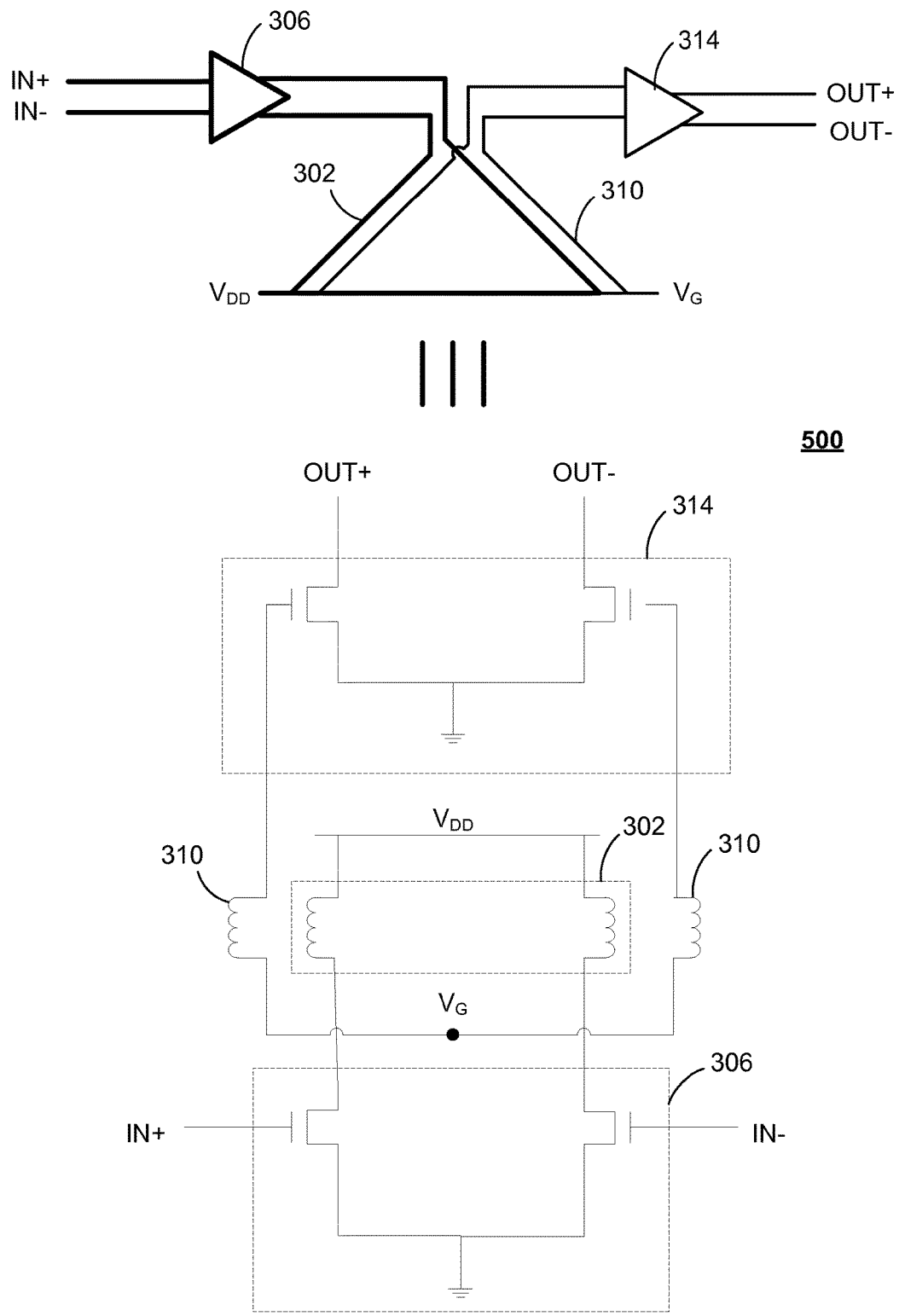
FIG. 5 is a schematic diagram illustrating an example of a transformer circuit in accordance with one or more implementations.

FIG. 5 illustrates a schematic diagram of transformer circuit 500 in accordance with one or more implementations. In some aspects, a power amplifier system having a low inductance transformer is provided. The power amplifier system can include a first stage power amplifier composed of first and second power amplifiers (e.g., power amplifiers 306 and 308). The power amplifier system also can include a second stage power amplifier composed of third and fourth power amplifiers (e.g., power amplifiers 310 and 312). The power amplifier system also can include a transformer circuit coupled between the first stage power amplifier and the second stage power amplifier.

For purposes of simplicity in discussing the schematic diagram of FIG. 5, transformer circuit 500 is shown with only half-loops 302 and 310 including power amplifiers 306 and 314. The corresponding portion of transformer circuit 400 is shown to demonstrate the relationship between the conceptual illustration and the schematic diagram.

In one or more implementations, power amplifier 306 associated with half-loop 302 includes a pair of switches that are n-type metal-oxide semiconductor (NMOS) transistors. In this regard, a source node of each of the switches is coupled to ground, a gate node of each of the switches receives a respective input of a differential input (e.g., IN+ or IN−), and a drain node of each of the switches is coupled to an inductor coupled to a supply voltage (e.g., e.g., $V_{DD}$).

Similarly, power amplifier 314 associated with half-loop 310 includes a pair of switches that are NMOS transistors. Here, a source node of each of the switches is coupled to ground, a gate node of each of the switches is coupled to an inductor coupled to a bias voltage, and a drain node of each of the switches provides a respective output of a differential output (e.g., OUT+ or OUT−). In some aspects, power amplifiers 306 and 314 may be implemented with p-type MOS (PMOS) transistors.

In some implementations, half loop 302 is configured to resonate out an output capacitance of power amplifier 306 (e.g., between source and ground) and half loop 310 is configured to resonate out an input capacitance of power amplifier 314 (e.g., between gate and ground).

One or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, elements, circuits, components, and methods described herein may be implemented as electronic hardware. Various illustrative blocks, elements, components, and methods have been described above generally in terms of their functionality. Whether such functionality is implemented as hardware depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "transformer", "receiver," "transmitter," and "power amplifier" all refer to electronic or other technological devices. These terms exclude people or groups of people.

The predicate words "configured to" does not imply any particular tangible or intangible modification of a subject, but, rather, are intended to be used interchangeably. In one or more implementations, a receiver configured to receive and process an operation or a component may also mean the receiver being operable to receive and process the operation.

A phrase such as "some aspects" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as "one or more implementations" does not imply that such implementation is essential to the subject technology or that such implementation applies to all configurations of the subject technology. A disclosure relating to an implementation may apply to all implementations, or one or more implementations. An implementation may provide one or more examples of the disclosure. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A transformer comprising:
   a plurality of differential ports;
   a first transformer winding comprising:
      a first transformer half-winding coupled to a first differential port of the plurality of differential ports, wherein the first transformer half-winding is configured to receive a first signal and a second signal via the first differential port, and a second transformer half-winding coupled to a second differential port of the plurality of differential ports, wherein a common node of the first transformer half-winding and the second transformer half-winding is coupled to a supply voltage; and a second transformer winding.

2. The transformer of claim 1, wherein the second transformer half-winding is configured to receive a third signal and a fourth signal via the second differential port.

3. The transformer of claim 1, wherein the second transformer winding comprises:
a third transformer half-winding coupled to a third differential port of the plurality of differential ports; and
a fourth transformer half-winding coupled to a fourth differential port of the plurality of differential ports.

4. The transformer of claim 3, wherein the third transformer half-winding is configured to output a third signal and a fourth signal via the third differential port.

5. The transformer of claim 1, wherein the first transformer winding is divided at a first node to form the first transformer half-winding and second transformer half-winding.

6. The transformer of claim 5, wherein the first transformer winding is divided symmetrically at the first node.

7. The transformer of claim 1, wherein the first transformer half-winding is configured to form one half of an inductance in the first transformer winding.

8. The transformer of claim 1, wherein the first transformer winding is configured to be inductively coupled with the second transformer winding.

9. An amplifier system, comprising:
a first stage amplifier comprising a first amplifier and a second amplifier;
a second stage amplifier comprising a third amplifier and a fourth amplifier; and
a transformer coupled between the first stage amplifier and the second stage amplifier, wherein the transformer comprises a primary loop and a secondary loop, the primary loop being configured to receive differential signals of the first amplifier, wherein a common node of the primary loop is coupled to a supply voltage.

10. The amplifier system of claim 9, wherein:
the primary loop comprises a first half-loop and a second half-loop,
the first half-loop is configured to receive the differential signals of the first amplifier, and
the second half-loop is configured to receive differential signals of the second amplifier.

11. The amplifier system of claim 9, wherein:
the secondary loop comprises a third half-loop and a fourth half-loop,
the third half-loop is configured to output differential signals to the third amplifier, and
the fourth half-loop is configured to output differential signals to the fourth amplifier.

12. The amplifier system of claim 9, wherein the primary loop and the secondary loop are divided symmetrically to form respective first and second half-loops.

13. The amplifier system of claim 12, wherein the first half-loop is configured to form one half of an inductance in a respective one of the primary and secondary loops.

14. The amplifier system of claim 9, wherein:
the primary loop is configured to receive differential signals from each of the first amplifier and the second amplifier, and
the secondary loop is configured to output differential signals to each of the third amplifier and the fourth amplifier.

15. A method of fabricating a transformer, the method comprising:
providing a primary loop of the transformer;
providing a first differential port;
coupling the primary loop to a first terminal and a second terminal of the first differential port to facilitate receiving, by the primary loop, a first signal over the first terminal and a second signal over the second terminal;
coupling a common node of the primary loop to a supply voltage;
providing a secondary loop of the transformer;
providing a second differential port; and
coupling the secondary loop to a third terminal and a fourth terminal of the second differential port to facilitate outputting, by the secondary loop, a third signal over the third terminal and a fourth signal over the fourth terminal.

16. The method of claim 15, wherein the coupling the primary loop comprises coupling the primary loop to the first terminal and the second terminal of the first differential port at a location of the primary loop that is symmetrical between the first terminal and the second terminal to allow differential behavior.

17. The method of claim 15, wherein the providing the primary loop comprises forming a first half-loop and a second half-loop in the primary loop, and wherein the coupling the primary loop comprises coupling the first half-loop to the first terminal and the second terminal.

18. The method of claim 17, wherein the coupling the primary loop further comprises coupling the second half-loop to a fifth terminal and a sixth terminal of a third differential port to facilitate receiving, by the primary loop, a fifth signal over the fifth terminal and a sixth signal over the sixth terminal.

19. The method of claim 17, wherein the providing the secondary loop comprises forming a third half-loop and a fourth half-loop in the secondary loop, and wherein the coupling the secondary loop comprises coupling the third half-loop to the third terminal and the fourth terminal.

20. The method of claim 19, wherein the coupling the secondary loop further comprises coupling the fourth half-loop to a seventh terminal and an eighth terminal of a fourth differential port to facilitate outputting, by the secondary loop, a seventh signal over the seventh terminal and an eighth signal over the eighth terminal.

\* \* \* \* \*